United States Patent [19]
Kaneaki et al.

[11] Patent Number: 5,068,661
[45] Date of Patent: Nov. 26, 1991

[54] MULTI-STAGE NOISE SHAPING OVER-SAMPLING D/A CONVERTER

[75] Inventors: Tetsuhiko Kaneaki, Ashiya; Kozo Nuriya; Yasunori Tani, both of Osaka, all of Japan

[73] Assignee: Matsushita Electric Industrial Co., Ltd., Japan

[21] Appl. No.: 244,047

[22] Filed: Sep. 13, 1988

[30] Foreign Application Priority Data

Sep. 14, 1987 [JP] Japan .................. 62-230114

[51] Int. Cl.$^5$ .............................................. H03M 1/66
[52] U.S. Cl. ...................................... 341/143; 341/144
[58] Field of Search ............... 341/118, 143, 145, 146, 341/200, 144

[56] References Cited

U.S. PATENT DOCUMENTS

| | | | |
|---|---|---|---|
| 4,071,842 | 1/1978 | Tewksbury | 341/143 |
| 4,209,773 | 6/1980 | Everard | 341/61 |
| 4,704,600 | 11/1987 | Uchimura et al. | 341/122 |
| 4,843,390 | 6/1989 | van Bavel et al. | 341/118 |

FOREIGN PATENT DOCUMENTS 61-177819  8/1986  Japan .

OTHER PUBLICATIONS

1987 IEEE International Symposium on Circuits and Systems, vol. 2, May 4–7, 1987, New York, U.S., pp. 463–466; J. J. Paulos et al.: "Improved Signal-To-Noise Ratio Using Tri-Level Delta-Sigma Modulation".

Proceedings of the IEEE 1988 Custom Integrated Circuits Conference, May 16–19, 1988, New York, U.S., pp. 21.2.1–21.2.3; L. Lorenzo et al.: "A 13 bit ISDN-Band Oversampled ADC Using Two-Stage Third Order Noise Shaping".

*Primary Examiner*—J. R. Scott
*Assistant Examiner*—Marc S. Hoff
*Attorney, Agent, or Firm*—Lowe, Price, LeBlanc, Becker & Shur

[57] ABSTRACT

A noise shaping quantization D/A converter in which an input digital signal is supplied to a single-integration sigma delta modulation circuit having quantization levels which include zero level, with a quantization error signal from the single-integration circuit being supplied to a double-integration noise shaping quantization circuit having quantization levels which also include zero level, and an output signal from the double-integration circuit being differentiated and summed with the single-integration circuit output to obtain a bit-compressed digital signal for D/A conversion. Offset of the analog output signal during a zero hold status of the input digital signal is eliminated, and increased efficiency of supply voltage utilization is attained, together with increased S/N ratio.

6 Claims, 6 Drawing Sheets

MULTI-STAGE NOISE SHAPING OVER-SAMPLING D/A CONVERTER

BACKGROUND OF THE INVENTION

1. Field of Technology

The present invention relates to a noise shaping over-sampling type of digital-to-analog converter whereby a digital signal having a relatively long word length is sampled at high speed to be converted to a digital signal having a relatively short word length, which is then converted to an analog signal.

2. Prior Art Technology

In recent years, with advances in digital signal processing technology, signals which were previously generally processed in analog form have come to be processed in digital form. Accompanying this trend, a demand has arisen for improved performance of digital-to-analog converters (hereinafter referred to as D/A converters), together with reduced manufacturing costs for applications such as compact disc (CD) audio reproduction systems. Specifically, D/A converter circuits are required which will provide a high S/N (signal-to-noise) ratio, reduced distortion of the output analog signal when a low amplitude signal is being reproduced, and which will be suitable for implementation within an integrated circuit (IC). Until very recently, almost every type of D/A converter was based upon generating respective current values from the bits of an input digital signal (e.g. by using a resistive ladder network) and summing these currents to obtain successive analog values from respective words of the digital signal. However such a method has certain inherent problems. Firstly, in order to maintain a high degree of conversion accuracy, i.e. to achieve linearity of conversion, a very high accuracy is required for the components (e.g. resistors) used in the conversion process. This requirement for components having very accurately predetermined values causes the manufacturing cost to be high. In addition, it is difficult to economically configure such components in an integrated circuit. Secondly, it is an inherent feature of such a D/A converter that the level of harmonic distortion of the output analog signal is substantial, when a low amplitude signal is being reproduced.

The minimum sampling frequency for representing an analog signal having a bandwidth $f_a$ is twice that bandwidth. Sampling frequency will be designated in the following as $f_s$, i.e. in this case $f_s = 2 \cdot f_a$. The level of quantization noise which is present in the output signal from a conventional D/A converter extends uniformly throughout the frequency range 0 to $f_s/2$. In order to effectively reduce the level of quantization noise in the analog output signal from a D/A converter, it is possible to use a sampling frequency value which is much higher than the minimum value described above. In this way, the quantization noise becomes spread over a wider frequency range, with a lower noise level within the bandwidth of interest. Since the noise at frequencies higher than the bandwidth of interest can be removed by a low pass filter, this method, known as "over-sampling" can provide a substantial improvement in S/N ratio.

Furthermore, in order to reduce the level of distortion at low amplitudes of reproduced signal, and to enable a high degree of digital/analog conversion linearity to be attained without requiring very high degrees of component accuracy, the number of bits of the digital signal which is converted should be kept small. For this reason, with a D/A converter utilizing such an over-sampling method, an input digital signal having a relatively long word length (e.g. 16 bits) is quantized to be converted to a digital signal having a shorter word length. This "bit compression" results in a digital signal having a high resolution (i.e. which is capable of representing one of a large number of analog signal levels) being converted to a digital signal having much lower resolution. Quantization of a digital signal in this way is performed utilizing a circuit section referred to as a local quantizer.

In order to further reduce the noise level of the output analog signal from a D/A converter system employing the over-sampling and quantization techniques described above, a technique called "noise-shaping quantization" has been developed. With this method, basically, an over-sampling digital input signal produced by A/D conversion is applied through an adder to a local quantizer. The quantization error of the local quantizer is obtained by subtracting the input and output signals of the local quantizer, the result is delayed by an amount equal to one sampling period of the input signal, and the delayed error signal is subtracted from the input digital signal in the adder. In this way, during each sampling period of the input signal, the quantization error of the previous sampling period is subtracted from that signal, and the result is supplied to the local quantizer. This has the effect of reducing the quantization noise level in the output signal at low frequencies, and increasing the noise level at high frequencies, i.e. "shaping" the noise frequency spectrum, so that the noise level within the frequency band to be reproduced is lowered.

A further development of this technique is described in Japanese Patent Laid-open No. 61-177819. FIG. 1 is a block diagram of an over-sampling type of D/A converter described in that patent document. In FIG. 1, a sigma delta modulation circuit 100 is configured as an integrator 118, a local quantizer 114, delay elements 115, 117 and 119, and adders 113 and 120. In addition, a second sigma delta modulation circuit 200 is configured from an adder 121, an integrator 122, a local quantizer 123, a delay element 124 and a differentiator 125. When the value of the input data supplied as input to local quantizer 114 or 123 is greater than or equal to zero, the local quantizer produces an output digital signal of fixed value, designated as quantization level 1, while when the input data is less than zero, a negative output of equal magnitude, designated as quantization level −1, is produced. The output from the adder 120, which is the difference between the input and output signals of the local quantizer 114, represents the quantization error of the local quantizer 114. The outputs from the delay element 115 and the differentiator 125 are added in the adder 127, and the result is supplied to a circuit 128 which executes the actual digital-to-analog conversion processing to produce an analog signal. To avoid confusion in the following, such a circuit will be referred to as D/A conversion circuit, while an overall system as shown in FIG. 1 will be referred to as a D/A converter. In this example, the possible output values from the delay element 115 are +1. In addition, the possible input values to the differentiator 125 are +1, so that the output values from the differentiator 125 are −2, 0, +2. Thus, the output from the adder 127 can take four values, i.e. −3, −1, +1 and +3.

FIG. 2 shows the output level and noise frequency spectrum distribution characteristic of the D/A converter of FIG. 1, for the case of a sine wave input signal being applied. As shown, a maximum S/N ratio of 90 dB is obtained when a sampling frequency is used which is 256 times the bandwidth to be reproduced.

With such a prior art configuration, designating the peak input signal level variation as +3, the corresponding maximum effective output level variation is +1, which is excessively small. This is due to the fact that the output from the first local quantizer will only vary between +1. Thus for example if a 2 bit D/A converter circuit is utilized for the D/A conversion circuit 128, with a supply voltage of 5 V (so that the analog output signal values corresponding to respective digital samples will be in the range 0 to 5 V), then when the input digital signal represents a 0 dB level sine wave signal (i.e. a maximum input level value) the resultant output signal from the D/A conversion circuit 128 will only attain 589 mV (rms). This very low level of output signal in response to a maximum value input signal is undesirable both from the aspect of attaining a sufficiently high S/N ratio and the aspect of effectiveness of supply voltage utilization. Furthermore the output values are +3 and +1, and do not include 0. Thus if the input signal to the D/A converter circuit is set in a "hold" status, representing a zero input signal level, a DC offset will invariable be produced in the output from the D/A converter circuit 128. This is a practical disadvantage in a practical system, e.g. in an audio reproduction system.

In addition to the above, there is also a need to achieve a higher level of S/N ratio for such a noise shaping D/A converter than is possible with the prior art example described above.

SUMMARY OF THE INVENTION

It is an objective of the present invention to overcome the problems set out above, by providing a D/A converter whereby a high value of output signal can be produced and whereby the range of output level values include zero, and furthermore whereby a high value of S/N ratio can be achieved.

In order to attain the objective set out above, an over-sampling D/A converter system according to the present invention comprises a noise shaping quantization circuit having a plurality of quantization levels which include a level of zero. Such a D/A converter preferably comprises a first noise shaping quantization circuit which is of single integration configuration and is coupled to receive a digital input signal, and a second noise shaping quantization circuit which is of double-integration configuration and is coupled to receive a quantization error signal produced from the first noise shaping quantization circuit, with an output signal produced from the second noise shaping quantization circuit being differentiated and the result added to the output signal from the first noise shaping quantization circuit to obtain an output signal that is converted to an analog signal.

More specifically, an over-sampling D/A converter according to the present invention comprises a noise shaping quantization circuit coupled to receive a digital signal as input, for producing a quantized output signal, and a digital-to-analog conversion circuit for converting the quantized output signal to an analog signal, wherein the noise shaping quantization circuit has final quantization levels of: $-L, -(L-1), \ldots, -1, 0, +1, \ldots, +(L-1), +L$, where L is a positive integer.

In addition, in such a D/A converter the noise shaping quantization circuit preferably comprises:

a single-integration sigma delta modulation circuit coupled to receive the input digital signal;

a double-integration sigma delta modulation circuit coupled to receive a quantization error signal produced from the single-integration sigma delta modulation circuit;

differentiator means for differentiating an output signal produced from the double-integration sigma delta modulation circuit; and, adder means for summing an output signal produced from the differentiator means and an output signal produced from the single-integration sigma delta modulation circuit;

wherein the digital-to-analog conversion circuit is converts a sum output signal produced from the adder means to an analog signal, and wherein the single-integration sigma delta modulation circuit has quantization levels of: $-N, -(N-1), \ldots, -1, 0, +1, \ldots, +(N-1), +N$ where N is a positive integer, and the double integration sigma delta modulation circuit has quantization levels of: $-M, -(M-1), \ldots, -1, 0, +1, \ldots, +(M-1), +M$ where M is a positive integer which is less than N

DESCRIPTION OF PREFERRED EMBODIMENTS

Figure 3:
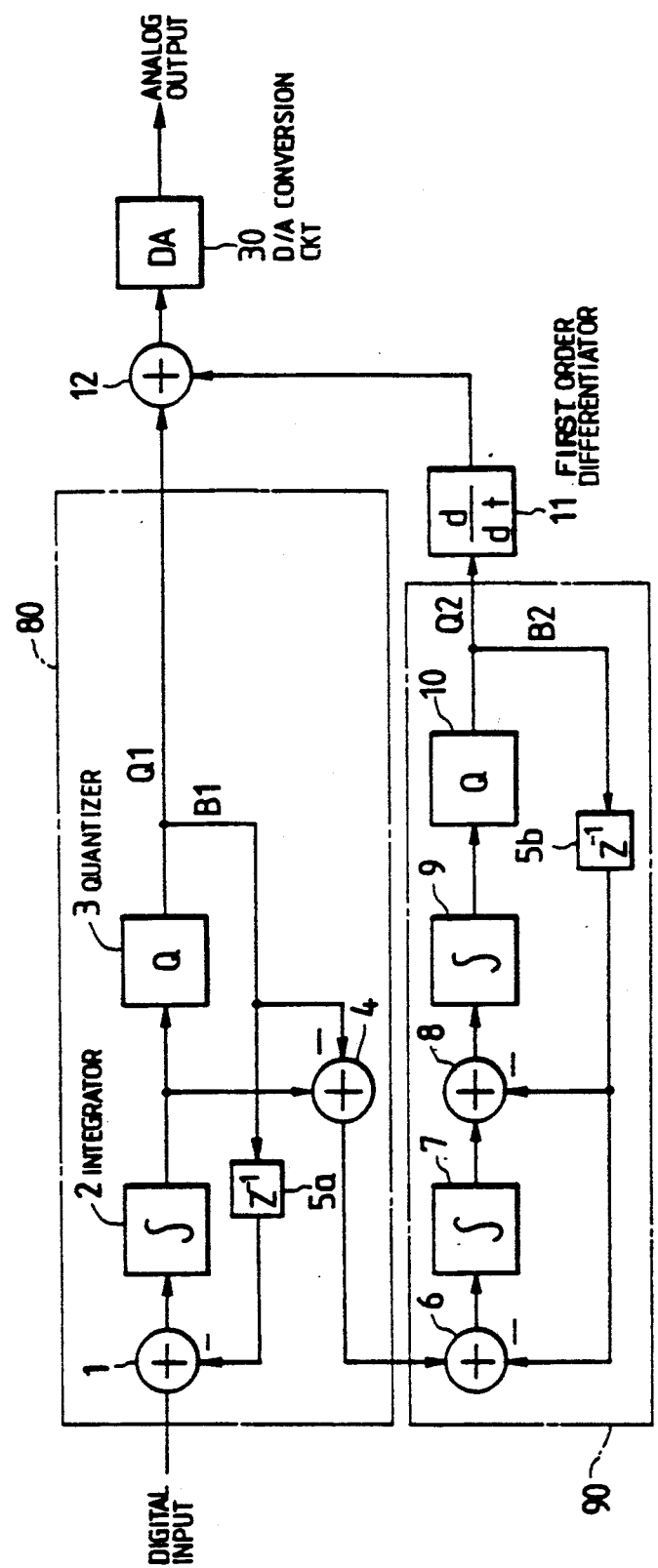
FIG. 3 is a block diagram of an embodiment of an over-sampling type of D/A converter according to the present invention.

FIG. 3 shows an embodiment of an over-sampling type of D/A converter according to the present invention. In FIG. 3, numerals 1 and 4 denote adders, 2 an integrator, 3 a local quantizer, and 5a a delay element having a delay time of $Z^{-1}$ where Z is $e^{-jwt}$ (where w is $2\pi f$ with f being frequency, and t is $1/f_s$ where $f_s$ is the sampling frequency of the input digital signal), i.e. a delay time of one period of the sampling frequency $f_s$. The integrator 2 has a transfer function H(z) of $1/(1-z^{-1})$. These constitute a single-integration sigma delta modulation circuit 80, which receives an over-sampling digital input signal IN, which in this example has a 16 bit word length. The local quantizer 3 produces an output digital signal which can take each of 7 quantization output levels, i.e. $-3, -2, -1, 0, +1, +2, +3$, in accordance with the input signal level.

Table 1 shows the input/output relationships between input digital signal values and output values from the local quantizer 3, for the case of the input signal IN having a 16 bit word length, in which case the maximum peak-to-peak range of the input signal IN is from −32768 to +32767. As shown in Table 1, the input signal IN has a minimum positive threshold value of 5632, i.e. if that input signal is within the range 0 to 5631, an output of 0 is produced by the local quantizer 3 as the quantization level value Q1 and as the feedback signal B1, while if the input signal increases from 5631 to 5632, a quantization level value +1 and a feedback signal value +11264 are produced from local quantizer 3. If the input signal level IN increases above the next positive threshold value, which in this example is 15 (3×5632), i.e. 16,896, then the quantization level value changes to +2 and the feedback signal value to +22,528 (equal to 2×11264). With this embodiment of the invention, which is particularly suited for use in an A/D and D/A system for use with digital audio discs (CDs), with digital to analog conversion being executed by pulse width modulation (PWM), it is preferable to obtain a total of 11 quantization level values from the adder 12. For this reason, the local quantizer 3 has 7 quantization level values as described above, while the local quantizer 10 of the double-integration noise shaping quantization circuit has 3 levels (i.e. −1, 0 and +1). It can thus be understood that the 16 bit input digital signal is converted to an output digital signal from the adder 12 which can represent only 11 levels, i.e. is a 4-bit digital signal, so that bit compression is achieved.

The relationships between the input signal threshold values, the corresponding values of feedback signal B1 and the range of the input signal IN, as set out in Table 1, are obtained as follows. First, designating the absolute value of the minimum threshold value as Y, this is obtained by first establishing a value which is higher than the maximum peak value of the input signal with respect to zero (this maximum value being 32,767 for a 16-bit digital signal) and is an integral multiple of 6, and dividing this higher value by 6. In the example of Table 1, this higher value is arbitrarily selected to be 33,792, which is divided by 6 to give a value for Y of 5,632. The positive threshold values of the digital input signal are then established as Y, 3Y and 5Y, while the negative threshold values are established as −Y, −3Y and −5Y. The values of feedback signal B1 respectively corresponding to the positive threshold values Y, 3Y and 5Y are established as 2Y, 4Y and 6Y, while the values of feedback signal B1 respectively corresponding to the negative threshold values −Y, −3Y and −5Y are established as −2Y, −4Y and −6Y.

The values for Q2 and B2 of the double integration sigma delta modulation circuit, shown in Table 2 below, are obtained in the same way as for Table 1.

The quantization output values thus produced from the local quantizer 3 are transferred as a feedback signal B1 to be subtracted from the input signal IN in the adder 1. The output from the adder 1 is supplied to the local quantizer 3 and also to an "add" input of the adder 4. The feedback signal B1 is applied to a "subtract" input of the adder 4, so that the adder 4 produces a quantization error signal consisting of successive values of quantization error of the local quantizer 3. The quantization level values from the local quantizer 3 are also supplied, designated as quantization level values Q1, to the adder 12. Since these quantization level values Q1 can only take the 7 values shown, these are transferred as data having a 4-bit word length.

6 and 8 denote adders, 7 and 9 denote integrators, 10 a local quantizer and 5b a delay element. These constitute a double-integration type of sigma delta modulation circuit 90 which receives as input the quantization error signal of the single-integration sigma delta modulation circuit 80 from the adder 4. This quantization error signal has the feedback output B2 from the local quantizer 10 (delayed by one sampling period by delay element 5b) subtracted therefrom in the adder 6, and the result is transferred through a first integrator 7, with this subtraction process being again repeated and the result applied to the input of the local quantizer 10.

The output from the local quantizer 10 can take each of 3 quantization level values (−1, 0, 1) in accordance with the input signal level thereto, and this output is applied to a first order differentiator 11. Table 2 shows the input/output relationship for the local quantizer 10, whose quantization levels designated as output Q2 are +1, 0 and −1. The output quantization level signal Q2 from local quantizer 10 is supplied to the first order differentiator 11, whose output is applied to the adder 12, which thus derives the sum of the respective quantization level values from the quantizer 3 and the differentiator 11, and supplies this sum to the D/A conversion circuit 30 to be converted to an analog signal.

In the Tables, it should be understood that each value listed as a quantization output, e.g. for Q1, is a quantization level value represented as a 4-bit digital signal, which is to be converted to a corresponding analog signal level, and that each of these has a corresponding value of the feedback signal B1. That is to say, a change in value of the feedback signal of, for example from +11264 to +22528, corresponds to a change from a +1 to a +2 quantization level of the output analog signal.

TABLE 1

| Input | Quantization output Q1 | Feedback output B1 |
|---|---|---|
| 28160 ~ | +3 | +33792 |
| 16896 ~ 28159 | +2 | +22528 |
| 5632 ~ 16895 | +1 | +11264 |
| −5632 ~ 5631 | ±0 | ±0 |
| −16896 ~ −5633 | −1 | −11264 |
| −28160 ~ −16897 | −2 | −22528 |
| ~ −28161 | −3 | −33792 |

TABLE 2

| Input | Quantization output Q1 | Feedback output B1 |
|---|---|---|
| 5632 ~ | +1 | +11264 |
| −5632 ~ 5631 | ±0 | ±0 |
| ~ −5633 | −1 | −11264 |

It should be noted that invention is not limited to the use of 7 quantization level values for the output Q1 from local quantizer 3 of FIG. 3, (i.e the values −3, −2, −1, 0, +1, +2, +3) and 3 levels (−1, 0 and +1) from the local quantizer 10, to be converted to 11 corresponding analog signal level values, although these values are optimum for the case of a D/A converter to be used in a compact disc (CD) reproduction system. In general, designating the quantization level values of a local quantizer of a single-integration sigma delta modulation circuit of an apparatus according to the present invention as $-N, -(N-1), \ldots, -1, 0, +1, \ldots, +(N-1), +N$ where N is a positive integer, and the quantization output levels of a local quantizer of a double integration sigma delta modulation circuit of the apparatus as $-M$, $-(M-1), \ldots, -1, 0, +1, \ldots, +(M-1), +M$ where M is a positive integer which is less than N, the final quantization levels of the overall noise shaping quantization circuit (obtained by adding the output from the single integration circuit to the differentiated output of the double-integration circuit) is $-L, -(L-1), \ldots, -1, 0, +1, \ldots, +(L-1), +L$ where L is a positive integer. The minimum threshold value Y for the local quantizer of the single-integration noise shaping quantization circuit is determined as R/2N, where R is an integral multiple of 2N which is greater than the maximum peak value (with respect to zero) of the input digital signal. The threshold values of the single-integration sigma delta modulation circuit quantization of the input digital signal IN, respectively corresponding to the aforementioned quantization levels of the single-integration circuit, are then obtained as: $-(2N-1).Y$, $-(2N-3).Y, \ldots -5.Y, -3.Y, -Y, +Y, +3Y, +5.Y, \ldots +(2N-3).Y, +(2N-1).Y$ The respectively corresponding values for the feedback signal B1 are obtained as: $2N.Y, -(2N-2).Y, \ldots -4Y, -2.Y, 0, +2.Y, +4.Y, \ldots +(2N-2).Y, +2N.Y$ Similarly the minimum threshold value Z for the local quantizer of the double-integration sigma delta modulation circuit is determined as P/2M, where P is an integral multiple of 2M which is greater than the maximum peak value (with respect to zero) of the quantization error signal supplied from the single integration sigma delta modulation circuit. The threshold values for the quantization error signal Q2 supplied to the double-integration sigma delta modulation circuit are obtained as: $-(2M-1).Z, -(2M-3).Z, \ldots -5.Z, -3.Z, -Z, +Z, +3Z, +5.Z, \ldots +(2M-3).Z, +(2M-1).Z$ The respectively corresponding values for the feedback signal B2 are obtained as: $2M.Z, -(2M-2).Z, \ldots -4Z, -2.Z, 0, +2.Z, +4.Z, \ldots +(2M-2).Z, +2M.Z$ The number of final quantization levels of the output signal from the adder 12 of this embodiment are determined as follows. The output from the delay element 5 naturally has the 7 levels of the output from the local quantizer 3, from $-3$ to $+3$ as described above. The output from the differentiator 11 has $-5$ levels, i.e. $-2, -1, 0, 1, 2$, since the input to the differentiator has 3 levels from $-1$ to $+1$. As a result, the output from the adder 12 can take 11 level values, i.e. $-5, -4, -3, -2, -1, 0, +1, +2, +3, +4, +5$. The maximum effective output levels are $+3$ with respect to peak input levels of $+5$ (since the maximum quantization output level from the first stage local quantizer 3 is $+3$). This is 5.1 dB higher than is possible with the prior art example described hereinabove. That is to say, more effective utilization of the supply voltage of the D/A conversion circuit 30 is attained.

Figure 4:
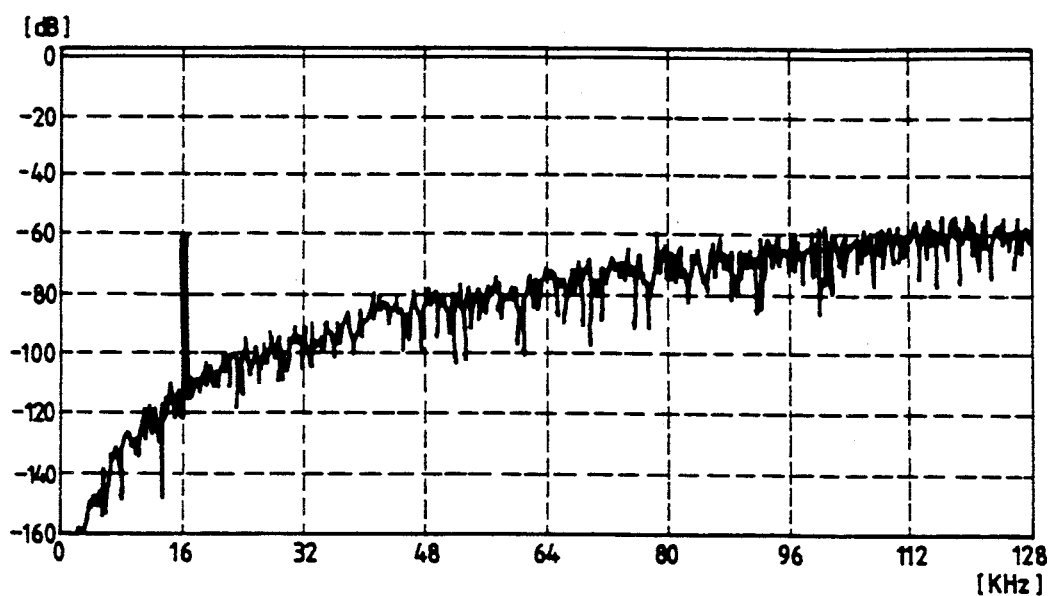
FIG. 4 shows the output and noise frequency spectrum distribution characteristic of the embodiment of FIG. 3.

FIG. 4 is a graph showing the output noise frequency spectrum distribution characteristic obtained with this embodiment, for the case of a sine wave input signal and assuming that the sampling frequency of the input signal is 64 times the bandwidth to be reproduced. As shown, a maximum S/N ratio of 103 dB is attained.

As shown in Table 1, the maximum feedback quantity of the first stage local quantizer is $+33792$, which exceeds the maximum value of a 16 bit word. This is done in order to prevent a phenomenon which occurs with such a sigma delta modulation circuit whereby the noise level is increased if the input signal level exceeds the maximum output value of the local quantizer.

Figure 5:
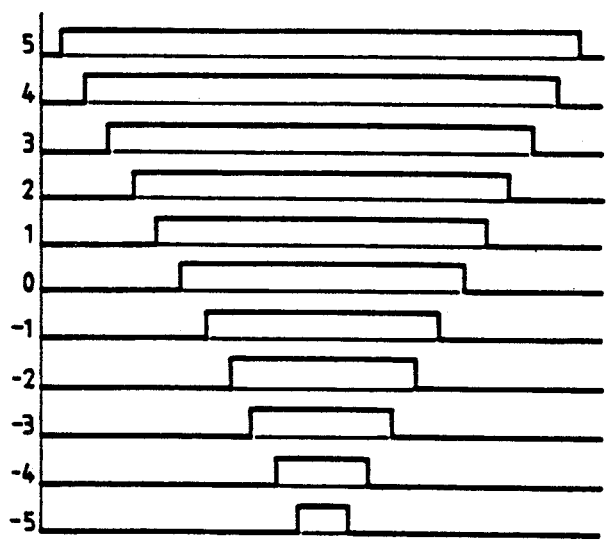
FIG. 5 shows output waveforms for the over-sampling type of D/A converter of FIG. 3.

FIG. 5 shows pulse waveforms produced by the D/A conversion circuit 30, for the case of a PWM (pulse width modulation) circuit being used as circuit 30. Pulses of respectively differing width are produced in response to the 11 input level values from $-5$ to $+5$ of the output signal from the adder 12 described above. If pulse width modulation is used in this way, highly linear D/A conversion which is free from zero-crossing distortion can be attained without the need to execute trimming of component values in the D/A conversion circuit. Thus for example the sampling frequency $f_s$ of the digital signal obtained by playback of a compact disc (digital audio disc) is 44.1 KHz. Using the oversampling D/A converter of FIG. 3 for such an application, a clock signal for operation of the system can have a frequency value of $32 f_s \times 24 = 33.8688$ MHz. This frequency value can be easily generated with very high accuracy, e.g. using a quartz crystal oscillator. Furthermore since such a clock signal frequency is equal to $f_s \times 2^N \times 3$, where N is an integer, timing signals for various circuits of an overall compact disc system can be easily produced.

Figure 6:
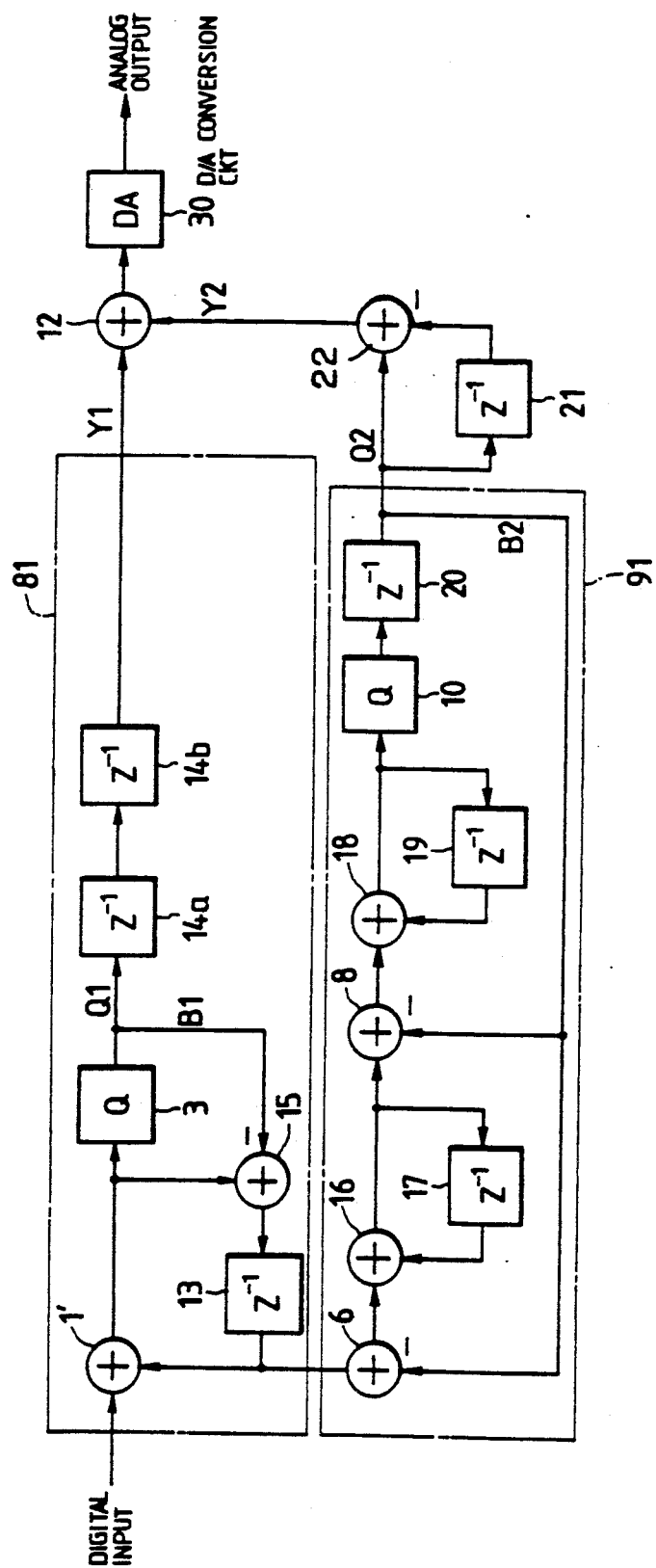
FIG. 6 is a block diagram showing in greater detail the over-sampling type of D/A converter of FIG. 3; and, FIG. 7 is a block diagram showing another example of a double integrator type of sigma delta modulation circuit.

FIG. 6 shows a practical configuration for an embodiment of an over-sampling type of D/A converter according to the present invention, which is functionally equivalent to the embodiment of FIG. 3. Components in FIG. 6 having identical functions to components in FIG. 3 are indicated by corresponding reference numerals, and detailed description of these will be omitted. 13, 14a and 14b denote delay elements, 1', 12 and 15 denote adders, and 3 is a quantization element. These constitute a single-integration sigma delta modulation circuit 81. The output from the delay element 13 is the quantization error of this quantization circuit.

6, 8, 16, 18 and 22 denote adders, 17, 19, 20 and 21 denote delay elements, and 10 denotes a quantization element. These constitute a double integration noise shaping quantization circuit 91. The circuit configured by the adder 16, the delay element 17 and the circuit configured by the adder 18 and delay element 19 constitute respective integrators, which respectively correspond to the integrators 7 and 9 in FIG. 3. The circuit configured by the adders 22, 22' and delay elements 21, 21' functions as a first order differentiator, which corresponds to the second order differentiator 11 shown in FIG. 3. The combination of adder 15, delay element 13 and adder 1' implements the combined functions of the integrator 2, adder 1 and delay 5a of FIG. 3. The characteristics of the embodiment of FIG. 6 are identical to those of the D/A converter of FIG. 3, however additional delay elements (i.e. delay 14a, etc) are included to compensate for delays which are introduced in practice by the adders.

Figure 7:
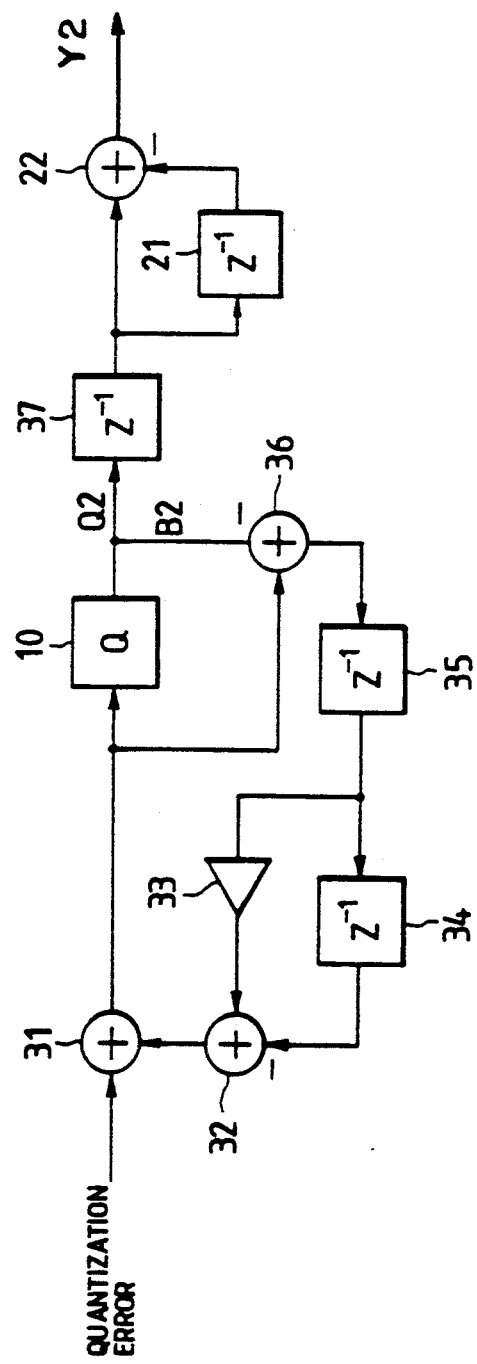

FIG. 7 shows another example of the double integration sigma delta modulation circuit 91 of the embodiment of FIG. 6. Components in FIG. 7 having identical functions to components in FIG. 3 are indicated by corresponding reference numerals, and detailed description of these will be omitted. 33 denotes a factor multiplier, which multiplies the input applied thereto by a factor of 2. This is executed by a one-bit shift. An identical transfer function to that of FIG. 6 can be obtained with this noise shaping quantization circuit, while a slight reduction in the amount of hardware required can be achieved, by comparison with the circuit of FIG. 6.

Specific values of quantization levels of the quantization elements 3 and 10 for the above embodiments have been given in the Tables 1 and 2. However the invention is not limited to these values, and for example the values shown in Tables 3 and 4 below could also be utilized, with the values given in these Tables being determined by the criteria for the threshold values and the local quantizer output levels described hereinabove. If the values of Tables 3 and 4 are used, then the scale of the quantization elements can be reduced, by comparison with the case in which the values given in Tables 1 and 2 are used. However the output level will be lower.

TABLE 3

| Input | Quantization output Q1 | Feedback output B1 |
|---|---|---|
| 30720~ | +3 | +36864 |
| 18432~30719 | +2 | +24567 |
| 6144~18431 | +1 | +12288 |
| −6144~61343 | ±1 | ±0 |
| −18432~−6145 | −1 | −12288 |
| −30720~−18433 | −2 | −24576 |
| ~−30721 | −3 | −36864 |

TABLE 4

| Input | Quantization output Q2 | Feedback output B2 |
|---|---|---|
| 6144~ | +1 | +12288 |
| −6144~6143 | ±0 | ±0 |
| ~−6145 | −1 | −12288 |

Figure 1:
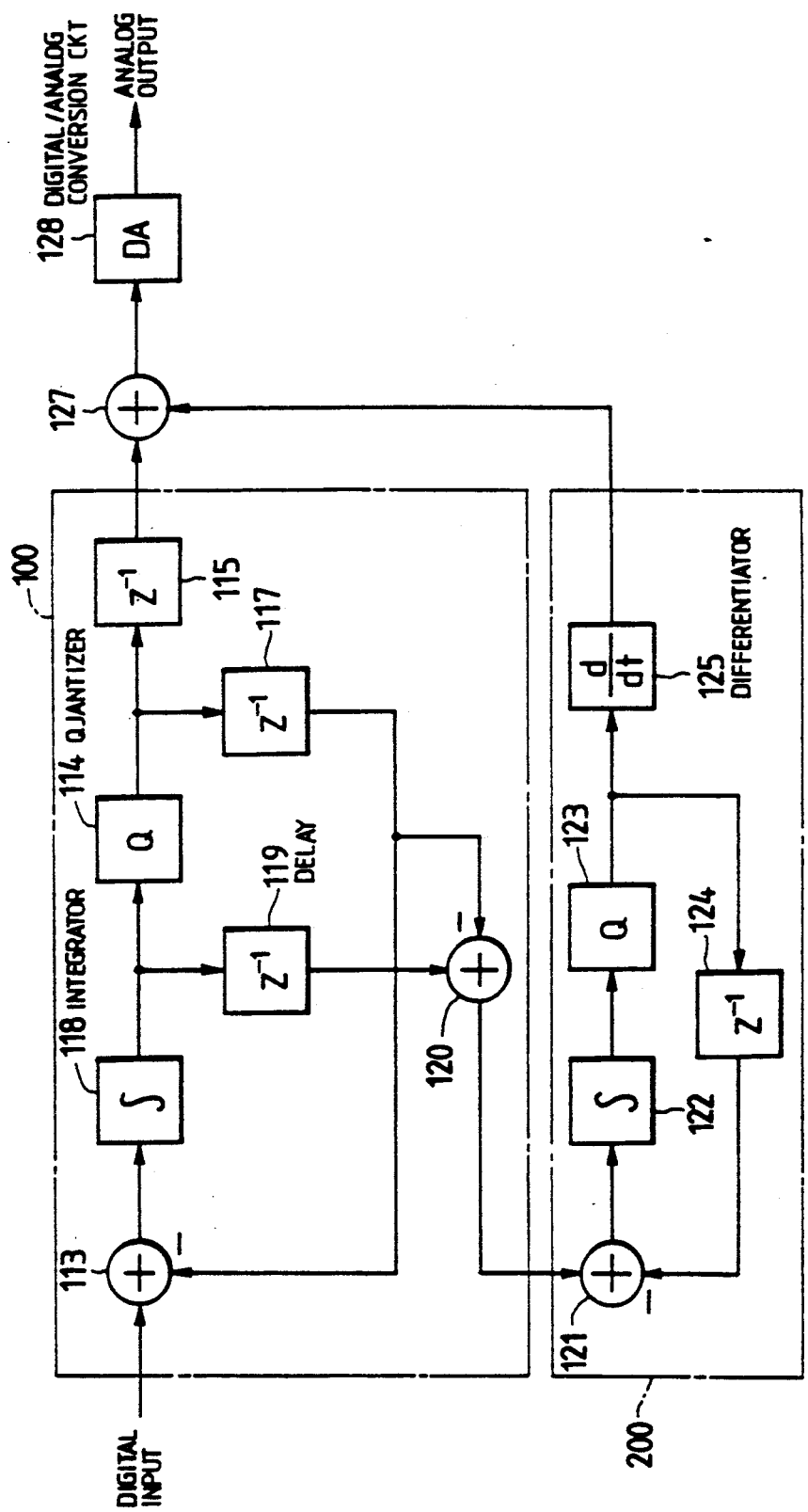
FIG. 1 is a block diagram showing an example of a prior art over-sampling type of D/A converter.
Figure 2:
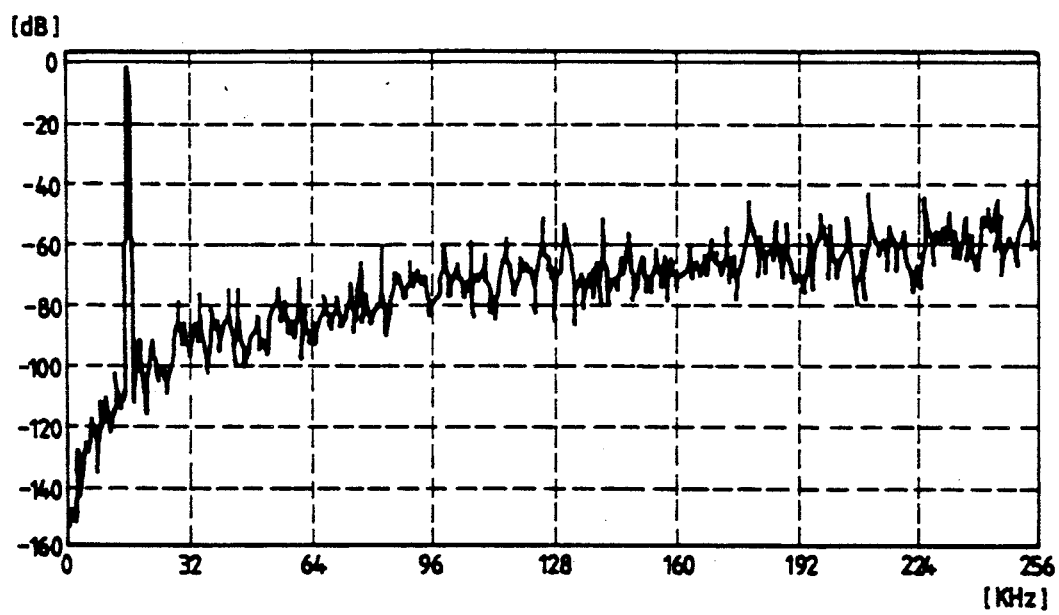
FIG. 2 shows output and noise frequency spectrum distribution characteristic for the over-sampling type of D/A converter of FIG. 1.

An over-sampling noise shaping quantization D/A converter as described above has been manufactured as part of a system formed of a digital filter, noise-shaping quantization circuits, and PWM D/A conversion circuit, formed on a signal LSI chip. A S/N ratio of 103 dB is achieved with an over-sampling factor of 64 times, by comparison with which the prior art system described hereinabove is capable of achieving an S/N ratio of only 90 dB with the higher over-sampling factor of 256 times. Furthermore when pulse width modulation is used for the D/A conversion circuit, the present invention enables a clock signal frequency to be utilized for controlling the D/A conversion circuit which is 1408 (i.e. 64×22) times the bandwidth to be reproduced, as compared with the need to use a clock signal frequency of 2048 (i.e. 256×8) times the bandwidth to be reproduced, in the case of the prior art noise shaping quantization D/A converter of FIG. 1.

Although the invention has been described with reference to specific embodiments and numeric values, it should be noted that various changes to these may be envisaged, which fall within the scope claimed for the invention. Thus for example although the invention has been described for the case of a preferred embodiment of a noise shaping quantization circuit formed of a single integration sigma delta modulation circuit and a double integration sigma delta modulation which receives the quantization error of the single-integration sigma delta modulation circuit, it would also be possible to utilize a double-integration sigma delta modulation circuit in place of the single-integration sigma delta modulation shaping circuit of the described embodiments.

What is claimed is:

1. An over-sampling digital-to-analog converter, comprising:
   a noise shaping quantization circuit coupled to receive a digital signal as input, for producing a quantized output signal;
   a digital-to-analog conversion circuit for converting said quantized output signal to an analog signal;
   wherein said noise shaping quantization circuit has final quantization levels of $-L$, $-(L-1)$, ..., $-1$, $0$, $+1$, ..., $+(L-1)$, $+L$, where L is a positive integer, and in which said noise shaping quantization circuit comprises:
   a single-integration sigma delta modulation circuit coupled to receive said input digital signal;
   a double-integration sigma delta modulation circuit coupled to receive a quantization error signal produced from said single-integration sigma delta modulation circuit;
   differentiator means for differentiation an output signal produced from said double-integration sigma delta modulation circuit; and,
   adder means for summing an output signal produced from said differentiator means and an output signal produced from said single-integration sigma delta modulation circuit;
   wherein said digital-to-analog conversion circuit converts a sum output signal produced from said adder means to an analog signal, and wherein said single-integration sigma delta modulation circuit has quantization levels of $-N$, $-(N-1)$, ..., $-1$, $0$, $+(N-1)$, $+N$, where N is a positive integer, and said double-integration sigma delta modulation circuit has quantization levels of $-M$, $-(M-1)$, ..., $-1$, $0$, $+M$, where M is a positive integer which is less than N.

2. An over-sampling digital-to-analog converter comprising:
   a noise shaping quantization circuit coupled to receive a digital signal as input, for producing a quantized output signal; and,
   a digital-to-analog conversion circuit for converting said quantized output signal to an analog signal;
   wherein said noise shaping quantization circuit has final quantization levels of $-L$, $-(L-1)$, ..., $-1$, $0$, $+1$, ..., $+(L+1)$, $+L$, where L is a positive integer having a value greater than one, and in which said noise shaping quantization circuit comprises:
   a first single-integration sigma delta modulation circuit coupled to receive said input digital signal;
   a second single-integration sigma delta modulation circuit coupled to receive a quantization error signal produced form said first single-integration sigma delta modulation circuit;
   differentiator means for differentiating an output signal produced from said second single-integration sigma delta modulation circuit; and,
   adder means for summing an output signal produced form said differentiator means and an output signal produced form said first single-integration sigma delta modulation circuit;
   wherein said digital-to-analog conversion circuit converts a sum output signal produced from said adder means to an analog signal, and wherein said first single-integration sigma delta modulation circuit has quantization levels of $-N$, $-(N-1)$, ..., $-1$, $0$, $+1$, ..., $+(N-1)$, $+N$ where N is a positive integer.

3. An over-sampling digital-to-analog converter comprising:
   a single-integration sigma delta modulation circuit coupled to receive a digital input signal;

a double-integration sigma delta modulation circuit coupled to receive a quantization error signal produced form said single-integration sigma delta modulation circuit;

differentiator means for differentiating an output signal produced from said double-integration sigma delta modulation circuit; and adder means for summing an output signal produced from said differentiator means and an output signal produced from said single-integration sigma delta modulation circuit;

wherein said digital-to-analog conversion circuit converts a sum output signal produced from said adder means to an analog signal, and wherein said single-integration sigma delta modulation circuit has quantization levels of $-N$, $-(N-1)$, ..., $-1$, 0, $-1$, ..., $+(N-1)$, $+N$ where N is a positive integer.

4. An over-sampling digital-to-analog converter comprising:

a single-integration sigma delta modulation circuit coupled to receive a digital input signal;

a double-integration sigma delta modulation circuit coupled to receive a quantization error signal produced form said single-integration sigma delta modulation circuit;

differentiator means for differentiating an output signal produced from said double-integration sigma delta modulation circuit; and adder means for summing an output signal produced from said differentiator means and an output signal produced from said single-integration sigma delta modulation circuit;

wherein said digital-to-analog conversion circuit converts a sum output signal produced from said adder means to an analog signal, and wherein said single-integration sigma delta modulation circuit has quantization levels of $-3N$, $-2N$, $-1N$, 0, $+1N$, $+2N$, $+3N$, where N is a positive integer.

5. An over-sampling digital-to-analog converter comprising:

a single-integration sigma delta modulation circuit coupled to receive a digital input signal;

a double-integration sigma delta modulation circuit coupled to receive a quantization error signal produced form said single-integration sigma delta modulation circuit;

differentiator means for differentiating an output signal produced from said double-integration sigma delta modulation circuit; and adder means for summing an output signal produced from said differentiator means and an output signal produced from said single-integration sigma delta modulation circuit;

wherein said digital-to-analog conversion circuit converts a sum output signal produced from said adder means to an analog signal, and wherein said single-integration sigma delta modulation circuit has quantization levels of $-3$, $-2$, $-1$, 0, $+1$, $+2$, $+3$, and wherein a minimum positive threshold value Y for quantization of said input digital signal by said single-integration sigma delta modulation circuit is established as R/6, where R is an integral multiple of 6 and is greater than a maximum positive value with respect o zero of said input digital signal, and in which threshold values of said single-integration sigma delta modulation circuit feedback signal respectively corresponding to said quantization levels of said single-integration sigma delta modulation circuit are established as $-5Y$, $-3Y$, $-Y$, $+Y$, $+3Y$, $+5Y$, and moreover in which feedback signal levels of said sigma delta modulation circuit respectively corresponding to said quantization levels of said single-integration sigma delta modulation circuit are established as $-6Y$, $-4Y$, $-2Y$, 0, $+2Y$, $+4Y$, $+6Y$.

6. An over-sampling digital-to-analog converter according to claim 5, in which said double-integration sigma delta modulation circuit has quantization levels of $-1$, 0 and $+1$.

* * * * *